United States Patent
Horibe et al.

(10) Patent No.: US 11,574,848 B2
(45) Date of Patent: Feb. 7, 2023

(54) UNDERFILL INJECTION FOR ELECTRONIC DEVICES

(71) Applicant: International Business Machines Corporation, Armonk, NY (US)

(72) Inventors: Akihiro Horibe, Yokohama (JP); Kuniaki Sueoka, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 17/158,159

(22) Filed: Jan. 26, 2021

(65) Prior Publication Data

US 2022/0238403 A1 Jul. 28, 2022

(51) Int. Cl.
| | | |
|---|---|---|
| H01L 21/67 | (2006.01) | |
| H01L 23/16 | (2006.01) | |
| H01L 23/02 | (2006.01) | |
| H01L 21/54 | (2006.01) | |

(52) U.S. Cl.
CPC .............. *H01L 23/16* (2013.01); *H01L 21/54* (2013.01); *H01L 21/67011* (2013.01); *H01L 23/02* (2013.01)

(58) Field of Classification Search
CPC ........... H01L 21/67126; H01L 21/6715; H01L 21/67236
See application file for complete search history.

(56) References Cited

U.S. PATENT DOCUMENTS

| | | | | |
|---|---|---|---|---|
| 5,817,545 | A * | 10/1998 | Wang ................. | B29C 33/0044 |
| | | | | 438/126 |
| 7,651,891 | B1 * | 1/2010 | Nguyen ................. | H01L 21/56 |
| | | | | 438/422 |
| 2003/0116864 | A1 * | 6/2003 | Shi ......................... | H01L 24/29 |
| | | | | 257/E21.503 |
| 2019/0348303 | A1 | 11/2019 | Kulkarni et al. | |
| 2019/0371755 | A1 | 12/2019 | Yeruva et al. | |
| 2020/0227385 | A1 | 7/2020 | Hiner et al. | |
| 2020/0365421 | A1 * | 11/2020 | Liu ....................... | H01L 21/561 |
| 2021/0020528 | A1 * | 1/2021 | Meier ................... | G01N 27/28 |

OTHER PUBLICATIONS

Guo et al., "Vacuum effect on the void formation of the molded underfill process in flip chip packaging", Microelectronics Reliability 55 (2015) 613-622.
Fan et al., "Study on Underfill/Solder Adhesion in Flip-Chip Encapsulation", IEEE Transactions on Advanced Packaging, vol. 25, No. 4, Nov. 2002, 8 pages. https://pdfs.semanticscholar.org/2d9c/876ceda2f3863c192ece8b35a48a2f5def3c.pdf.

(Continued)

*Primary Examiner* — Jae Lee
(74) *Attorney, Agent, or Firm* — Jeffrey M. Ingalls

(57) ABSTRACT

A device for applying underfill material into a space between a substrate and a semiconductor chip is provided. The device includes a frame housing configured to cover at least an outer edge area of the semiconductor chip that is bonded to the substrate. The device also includes a sealant attached to the frame housing and configured to contact the outer edge area of the semiconductor chip. The device also includes an outlet made on the frame housing for evacuating the space; and an inlet made on the frame housing for injecting the underfill material to the space.

23 Claims, 12 Drawing Sheets

(56) References Cited

OTHER PUBLICATIONS

Website, printed Dec. 14, 2020, Surface Energy and Surface Tension, 8 pages. http://web.kyoto-inet.or.jp/people/macchann/hiroshi/hyoumennkagaku.htm.

Yong et al., Superoleophobic surfaces, Chem Soc Rev, 2017, No. 14, vol. 46, 51 pages. https://pubs.rsc.org/en/content/articlepdf/2017/cs/c6cs00751a.

"Surface tension values of some common test liquids for surface energy analysis", printed Dec. 14, 2020, 4 pages, website. http://www.surface-tension.de/solid-surface-energy.htm.

"Solid surface energy data (SFE) for common polymers", printed Dec. 14, 2020, 1 page, website. http://www.surface-tension.de/solid-surface-energy.htm.

* cited by examiner

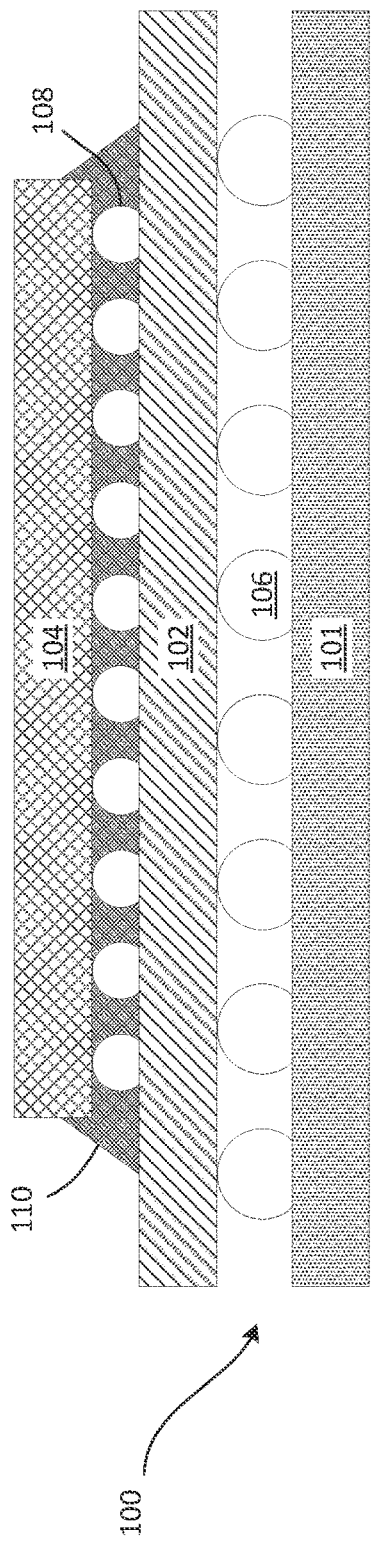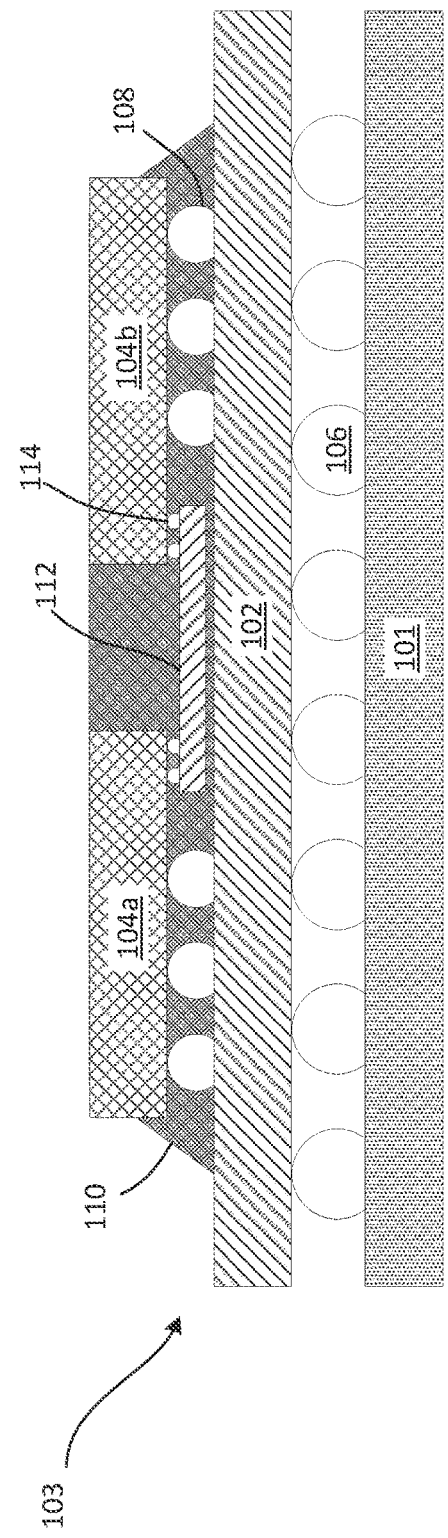

UNDERFILL INJECTION FOR ELECTRONIC DEVICES

BACKGROUND

The present disclosure relates generally to devices and methods for performing electronic chip underfills, and more particularly to method and devices for dispensing an underfill material using an underfill injection mold.

Underfill is used when electrically interconnecting a chip to, for example, a substrate or intermediate laminate. The underfill is often an epoxy or other curable resin that is designed to protect solder interconnects from, for example, fatigue due to cyclic strain during manufacturing and electrical test processing, reliability testing, and operational thermal cycles. The underfill also protects the fragile back-end-of-line (BEOL) chip structure.

Certain methods of applying an underfill material may rely solely on the capillary force of the underfill material to move the underfill in and around the bumps. Other methods may rely on a combination of vacuum conditions (or positive pressure conditions) as well as utilizing capillary action. However, certain methods utilizing this combination may require the use of a large and expensive vacuum chamber. Also, the relatively large size of the vacuum chamber can increase the time spent evacuating the chamber (i.e., generating the required level of vacuum to promote underfilling). Moreover, certain methods use large amounts of underfill that are not limited to areas under the chip.

SUMMARY

Embodiments of the present disclosure relate to a device for applying underfill material into a space between a substrate and a semiconductor chip is provided. The device includes a frame housing configured to cover at least an outer edge area of the semiconductor chip that is bonded to the substrate. The device also includes a sealant attached to the frame housing and configured to contact the outer edge area of the semiconductor chip. The device also includes an outlet made on the frame housing for evacuating the space; and an inlet made on the frame housing for injecting the underfill material to the space. This may allow for a vacuum space to be created that may aid in dispensing underfill, and this may also enable reductions in the amount of underfill material needed.

In certain embodiments, the sealant has an antifouling property. This may aid in releasing the sealant from the underfill material.

In certain embodiments, the sealant comprises at least one fluorinated polymer. This may aid in releasing the sealant from the underfill material.

In certain embodiments, wherein the sealant has a portion that is inclined relative to a main surface of the substrate, and wherein the inclined portion of the sealant corresponds to a shape of a fillet portion of the underfill material. This may help to minimize the size of the vacuum chamber, and this may help to minimize the amount of underfill that may be required.

In certain embodiments, the device may include at least one exhaust port. This may allow for the creation of a vacuum that may facilitate distributing the underfill material.

In certain embodiments, the sealant includes a mechanical shutter on an outlet side of the device. This may allow for the creation of a vacuum, and to restrict or prevent underfill material from entering the outlet of the device.

In certain embodiments, the sealant includes a fluorinated gas permeable membrane on an outlet side of the device. This may allow for the creation of a vacuum, and to restrict or prevent underfill material from entering the outlet of the device.

In certain embodiments, wherein the sealant is configured to contact at least outer upper edges of the semiconductor chip to form a sealed interior space for the underfill material. This may allow for the formation of a vacuum seal, and this may help to minimize the size of the vacuum chamber.

In certain embodiments, a size of the sealed interior space at least substantially corresponds to a size of the semiconductor chip. This may help to minimize the size of the vacuum chamber, and this may help to minimize the amount of underfill that may be required.

In certain embodiments, a size of the sealed interior space at least substantially corresponds to a size of the semiconductor chip plus a size of a fillet portion of the underfill material. This may help to minimize the size of the vacuum chamber, and this may help to minimize the amount of underfill that may be required.

Embodiments of the present disclosure relate to a method for applying underfill material into a space between a substrate and a semiconductor chip. The method includes: providing a frame housing configured to cover an outer edge area of the semiconductor chip that is bonded to the substrate; adhering a sealant that is attached to the frame housing to the outer edge area to seal the space; reducing pressure in the space by evacuating gases through an outlet on the frame housing; and injecting the underfill material into the space through an inlet on the frame housing.

In certain embodiments, the sealant has an antifouling property. This may aid in releasing the sealant from the underfill material.

In certain embodiments, the sealant comprises at least one fluorinated polymer. This may aid in releasing the sealant from the underfill material.

In certain embodiments, the sealant has a portion that is inclined relative to a main surface of the substrate, and wherein the inclined portion of the sealant corresponds to a shape of a fillet portion of the underfill material. This may help to minimize the size of the vacuum chamber, and this may help to minimize the amount of underfill that may be required.

In certain embodiments, the method further includes, after injecting the underfill, increasing the pressure in the space by introducing a gas into at least one exhaust port included in the frame. This may aide with the removal of the frame housing from the underfill injection material.

In certain embodiments, the method may further include, after injecting the underfill material, removing the frame and the sealant from the semiconductor chip. This may allow for removal of the frame housing prior to curing the underfill injection material.

In certain embodiments, the method may further include curing the underfill material after the removal of the frame house. This may allow for reduced manufacturing processing time, and may allow for a wider variety of underfill injection material compositions.

In certain embodiments, the sealant is configured to contact at least outer upper edges of the semiconductor chip to form a sealed interior space for the underfill material. This may allow for the formation of a vacuum seal, and this may help to minimize the size of the vacuum chamber.

In certain embodiments, wherein a size of the sealed interior space at least substantially corresponds to a size of the semiconductor chip. This may help to minimize the size of the vacuum chamber, and this may help to minimize the amount of underfill that may be required.

In certain embodiments, wherein a size of the sealed interior space at least substantially corresponds to a size of the semiconductor chip plus a size of a fillet portion of the underfill material. This may help to minimize the size of the vacuum chamber, and this may help to minimize the amount of underfill that may be required.

Embodiments of the present disclosure relate to a system for applying underfill material into a space between a substrate and a semiconductor chip. The system includes: at least one processor; at least one memory coupled to the processor; an underfill injection device including a frame housing configured to cover at least an outer edge area of the semiconductor chip that is bonded to the substrate, a sealant attached to the frame housing and configured to contact the outer edge area of the semiconductor chip, an outlet made on the frame housing for evacuating the space, and an inlet made on the frame housing for injecting the underfill material to the space; an underfill device position module operable with the processor and memory to cause the underfill injection device to be moved into alignment with the semiconductor chip; and an underfill device control module operable with the processor and the memory to cause the injection of the underfill material into the space.

In certain embodiments, the sealant has an antifouling property. This may aid in releasing the sealant from the underfill material.

In certain embodiments, the sealant comprises at least one fluorinated polymer. This may aid in releasing the sealant from the underfill material.

In certain embodiments, the sealant has a portion that is inclined relative to a main surface of the substrate, and wherein the inclined portion of the sealant corresponds to a shape of a fillet portion of the underfill material. This may help to minimize the size of the vacuum chamber, and this may help to minimize the amount of underfill that may be required.

In certain embodiments, the frame housing may include at least one exhaust port. This may allow for the creation of a vacuum that may facilitate distributing the underfill material.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 1A is a cross-sectional view of an example of a large die single chip package with underfill, in accordance with an embodiment.

FIG. 1B is a cross-sectional view of a heterogenous multichip package with underfill, in accordance with certain embodiments.

DETAILED DESCRIPTION

Figure 2:
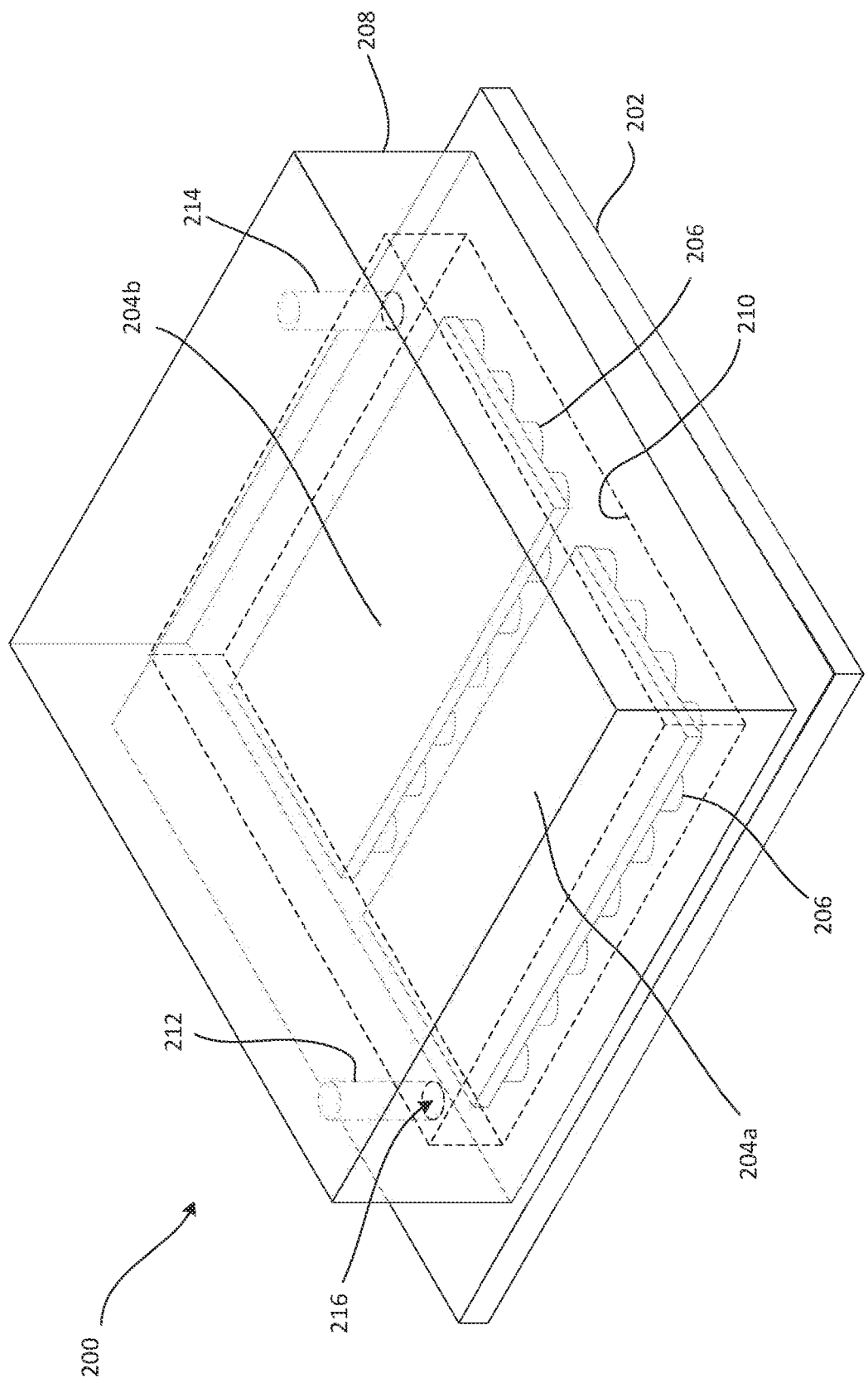
FIG. 2 is a cross-sectional view of an underfill injection device, in accordance with certain embodiments.

Embodiments in accordance with the present disclosure provide methods and devices for injecting underfill for single chip or multiple chip modules, and specifically injecting underfill in areas in and around electrical interconnect bumps (e.g., fine or large pitched bumps such as solder bumps).

The present embodiments provide underfill to multiple laminates, or chips, in such a way as to prevent gaps and voids in the underfill. An underfill injection tool having a mold (or interior void space) that generally corresponds to a shape of the underlying chips allows for a relatively small volume of air (i.e., atmosphere or other gas mixtures) around the underfill area. Thus, when a vacuum is applied to the mold during the application of the underfill, the small volume of air allows the vacuum to be achieved in a shorter period of time, thus saving processing time and increasing manufacturing throughput. Also, the small volume of the underfill also reduces the volume of the underfill material that must be supplied, thereby reducing costs. Moreover, because the overall contact surface area between the underfill injection tool and the underlying chip/package can be reduced, the underfill injection tool (or mold) may be removed (or released) from the chip prior to curing the underfill material. Not only does this make it possible to create a consistent, gap-free underfill layer across an entire wafer, or multi-chip substrate, but also enables reductions in the processing time. The present embodiments are described and shown as having one or two chips mounted on a common wafer, but it should be understood that the embodiments are equally applicable to any given array of chips mounted on a common substrate.

Referring now to the figures and initially to FIG. 1, a cross-sectional view of an example of a package 100 having a large die (or chip) with underfill already in place is shown, in accordance with an embodiment. As shown in FIG. 1B, a substrate 101 is provided. In certain examples, the substrate 101 may be formed from, for example, an insulator layer and a semiconductor layer. In one specific example, the insulator layer (not shown) of the substrate 101 may be a glass layer and the semiconductor layer (not shown) of the substrate 101 may be a silicon-containing material. In certain embodiments, the substrate 101 may be a printed wiring board (PWB). In an alternative embodiment, a bulk semiconductor substrate may be used instead. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

As shown in FIG. 1A, a laminate 102 is attached to the substrate 101. The laminate 102 may be bonded to the substrate 101 via a set of solder connection points 106. In certain embodiments, the laminate 102 may be mounted by flip chip bonding and the solder connection points 106 may be controlled collapse chip connections (known as "C4") solder points. In certain examples, the solder connection points 106 may be a ball grid array (BGA) solder and may be about 500 µm in diameter, or any other suitable diameter. In other examples, the BGA may instead be a Land Grid Array (LGA). The laminate 102 may be formed from an organic material or any other appropriate intermediate material and may include multiple conductor and insulator layers. As shown in FIG. 1A, in certain embodiments, one or more chips 104 may then be attached to the laminate 102. This chip 104 may be made of silicon or other semiconductor materials. The chip 104 may be connected to the laminate 102 by a different set of solder points 108. The solder points 108 may have, for example, a diameter of about 80 µm (or any other suitable diameter), and may be arranged at a pitch of about, for example, 150 µm. The material of the solder points 108 may be the same as, or different from, the material of the solder connection points 106.

An underfill material 110 may be added to protect the connections, e.g., between the laminate 102 and the substrate 101 (not shown) or between the chip 104 and the laminate 102. The underfill material 110 may be selected and processed so that the underfill reaches the target gap only. The underfill material 110 is to be deposited between, e.g., the laminate 102 and the chip 104. However, the presence of the solder points 106 and the small gap between the laminate 102 and the chip 104 may impede the flow of the underfill. As discussed in further detail below, a vacuum may be generated in the gap between the laminate 102 and the chip 104 to aid in the distribution of the underfill material 110. In one example, the air pressure of the vacuum may be about 100 Pa.

Referring now to FIG. 1B, a cross-sectional view of an example of a heterogeneous package 103 having a plurality of chips 104a and 104b with underfill material 110 already in place is shown, in accordance with an embodiment. As shown in FIG. 1B, a substrate 101 is provided, similar to that shown and described above with reference to FIG. 1A. The materials and the layers of the heterogeneous package 103 may be similar as the similarly numbered layers described above with respect to FIG. 1A above, with a difference that two chips 104a and 104b are used in this configuration. However, it should be appreciated that in other examples, any suitable number of chips other than two may also be contemplated. As also shown in FIG. 1B, a bridge or connection member 112 may be attached to the underside of the chips 104a and 104b with a third set of solder points 114.

In certain embodiments, the third set of solder points 114 may be a micro C4 array having, for example, a diameter of about 15-40 µm and a pitch of about 30-75 µm. As shown in both FIGS. 1A and 1B, the underfill material 110 has been introduced and has evenly distributed across all of the chips 104, 104a and 104b without voids. It should be recognized that the principles described herein may be extended to include providing underfill material between a laminate 102 and one or more chips 104 and to providing underfill material between a PCB (not shown) and one or more chips 104. It should also be understood that what has been described is equally applicable to an array of chips mounted on a common substrate, where an underfill mold mount (see e.g., FIG. 2 underfill injection mold 208) can also be used to dispense the underfill material.

In certain embodiments, the assembly process for the package 100 includes first providing the solder points 108 to attach the chip 104 to the laminate 102, then providing the underfill material 110, and then finally attaching the structure to the substrate 101 with the solder points 106 (or BGA or LGA mount). In these embodiments, the solder points 106 are not assembled by a flip chip bonding tool, but rather assembled by a furnace reflow (or mass reflow).

Referring now to FIG. 2, a perspective view of an example of a underfill injection device 200 is shown, according to embodiments. As shown in FIG. 2, an underfill injection mold 208 is shown positioned on an underlying laminate 202 (see also the laminate 102 of FIGS. 1A and 1B). Different chips 204a and 204b are attached to the laminate 202 with an array of solder points 206. Although not depicted in FIG. 2 for the sake of simplicity and ease of illustration, a bridge or connection member (see, e.g., connection member 112 of FIG. 1B) may be attached to the underside of the chips 204a and 204b with solder points (see, e.g., the third set of solder points 114 of FIG. 1B). Although two chips 204a and 204b are shown in the example of FIG. 2, it should be appreciated that the general concepts related to the underfill injection device 200 may be applied to one or any other suitable number of underlying chips. In certain embodiments, the underfill injection mold 208 (or frame housing) includes an interior space 210 indicated by the dashed lines in FIG. 2. That is, in certain embodiments, the interior space 210 is sized appropriately to completely cover and surround the chips 204a and 204b.

In certain embodiments, the underfill injection mold 208 or frame housing includes one or more components that contact edges of the chips 204a and 204b to allow for a seal and the creation of a vacuum in the interior space 210. In certain embodiments, the underfill injection mold 208 also contacts at least portions of top surfaces of the chips 204a and 204b as well. As shown in FIG. 2, the underfill injection mold also includes an inlet 212 and an outlet 214. At the bottom of the inlet 212 is an underfill injection port 216 (i.e., a space or hole where the underfill material is injected into the interior space 210) that allows for the underfill material to flow in and around the solder points 206 under the chips 204a and 204b. In certain embodiments, the underfill injection mold 208 is sized to roughly correspond to the outer dimensions of the chips 204a and 204b, which allows for a reduction in the amount of underfill material that needs to be used, and which allows for a smaller interior space 210 volume thereby minimizing the time required to create a vacuum therein.

Figure 3:
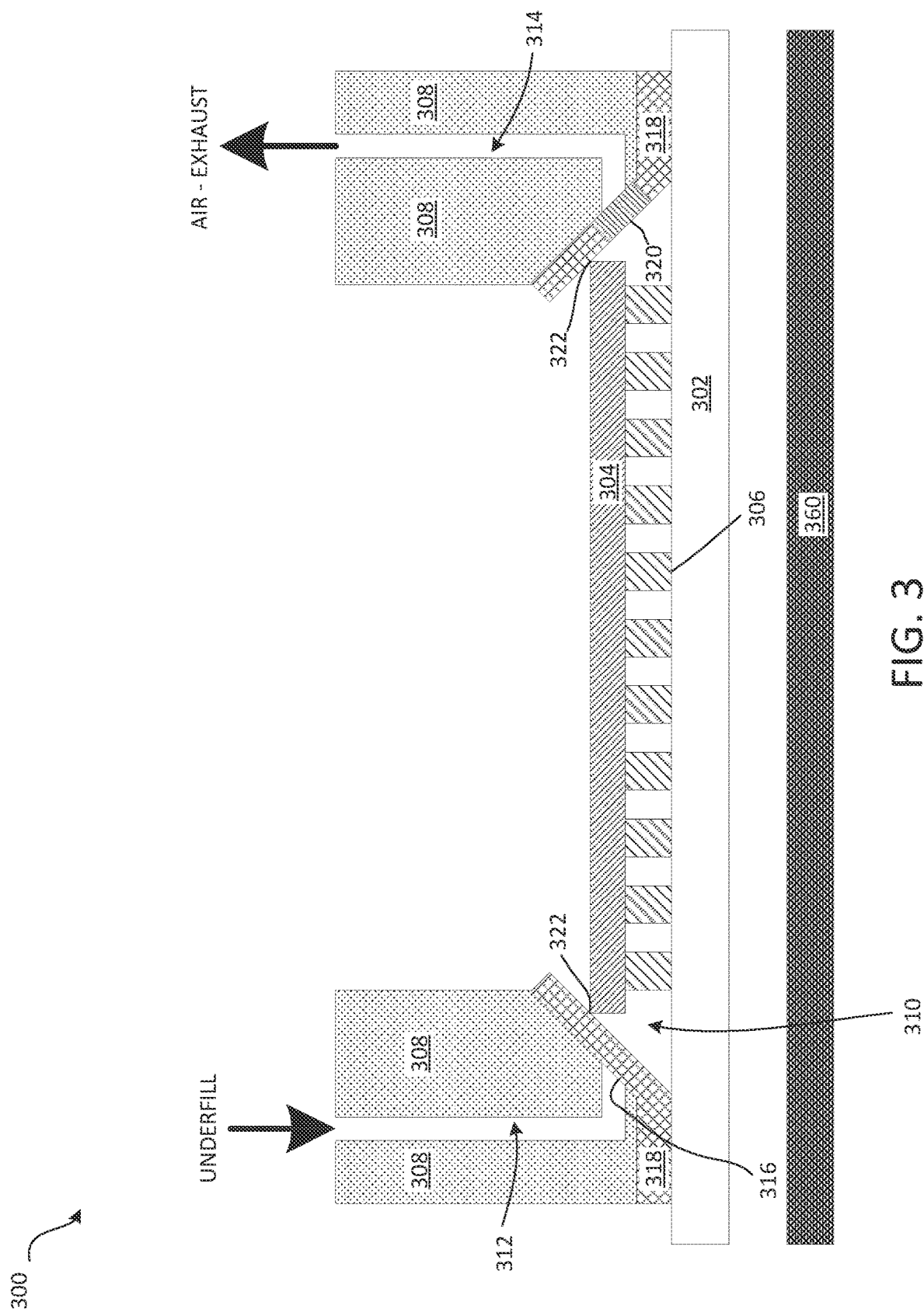
FIG. 3 is a cross-sectional view of an underfill injection device, in accordance with certain embodiments.

Referring now to FIG. 3, this figure is a cross-sectional view of an underfill injection device 300, in accordance with certain embodiments. In certain embodiments, the structure of the underfill injection device 300 corresponds in many respects to the underfill injection device 200 shown and described above with respect to FIG. 2, and it should be appreciated that certain elements shown in FIG. 3 (e.g., the antifouling pad 318) may also be included in the device of FIG. 2 (where certain elements were omitted for ease of illustration). As shown in FIG. 3, an underfill injection mold 308 is shown positioned on an underlying laminate 302. A single chip 304 is attached to the laminate 302 with an array of solder points 306. In certain embodiments, the underfill injection mold 308 includes an interior space 310. In certain embodiments, the interior space 310 of the underfill injection mold 308 is sized appropriately to completely cover and surround the chip 304. In certain embodiments, the underfill injection device 300 includes an antifouling pad 318 (or sealant) that contacts edges of the chip 304 to allow for a seal and the creation of a vacuum in the interior space 310. That is, in the embodiment shown in FIG. 3, the interior space 310 is created when the antifouling pad 318 contacts the upper edges 322 of the chip 304. In certain embodiments, the antifouling pad 318 (or sealant) has a portion that is inclined relative to a main surface of a substrate (or laminate 302), and the inclined portion of the sealant corresponds to a shape of a fillet portion of the underfill material. In certain embodiments, the antifouling pad 318 of the underfill injection device 300 also contacts at least portions of top surfaces of the chip 304 in addition (or as an alternative to) the upper edges 322, as described in further detail below with regard to FIGS. 4A-4E.

The antifouling pad 318 (or coating, or surface treatment of the underfill injection mold 308) may be comprised of a soft material (e.g., a polymer) that may also function as a height adjuster. In certain embodiments, the antifouling pad 318 may be comprised of one or more fluorinated polymer materials such as SFE-B002H (manufactured by AGC Seimi Chemical Co., Ltd.) or Somaflon A1 (manufactured by Somar Corp.). These materials may be used alone or as a combination of two or more fluorinated or non-fluorinated materials. In certain embodiments, the material of the antifouling pad 318 may be selected to minimize any adhesion between the uncured underfill material and the antifouling pad 318 itself.

As shown in FIG. 3, the underfill injection mold 308 also includes an inlet 312 and an outlet 314. The outlet 314 may be connected to a vacuum mechanism (not shown) that allows air to be exhausted from the interior space 310 of the underfill injection mold 308, and to create a vacuum therein. At the bottom of the inlet 312 is an underfill injection port 316 (i.e., a space, hole, membrane or mechanical shutter) where the underfill material is injected into the interior space 310 and that allows for the underfill material to flow in and around the solder points 306 under the chip 304. As also shown in FIG. 3, a fluorinated membrane 320 (or mechanical shutter) may be provided at the outlet 314, and it may allow for air to escape from the interior space 310 in response to a vacuum connected to the outlet 314, but it may prevent the underfill material from passing. In other words, the fluorinated membrane 320 may be only gas permeable. The material of the fluorinated membrane 320 may be same as or different than the material of the antifouling pad 318. In certain embodiments, the underfill injection device 300 may also include a heater 360 for underfill viscosity control. The heater 360 may operate at a temperature range of, for example, 30-150° C. (or any suitable temperature depending on the composition of the underfill material), and it may be movable in different directions in conjunction with a moving device (not shown).

Figure 4A:
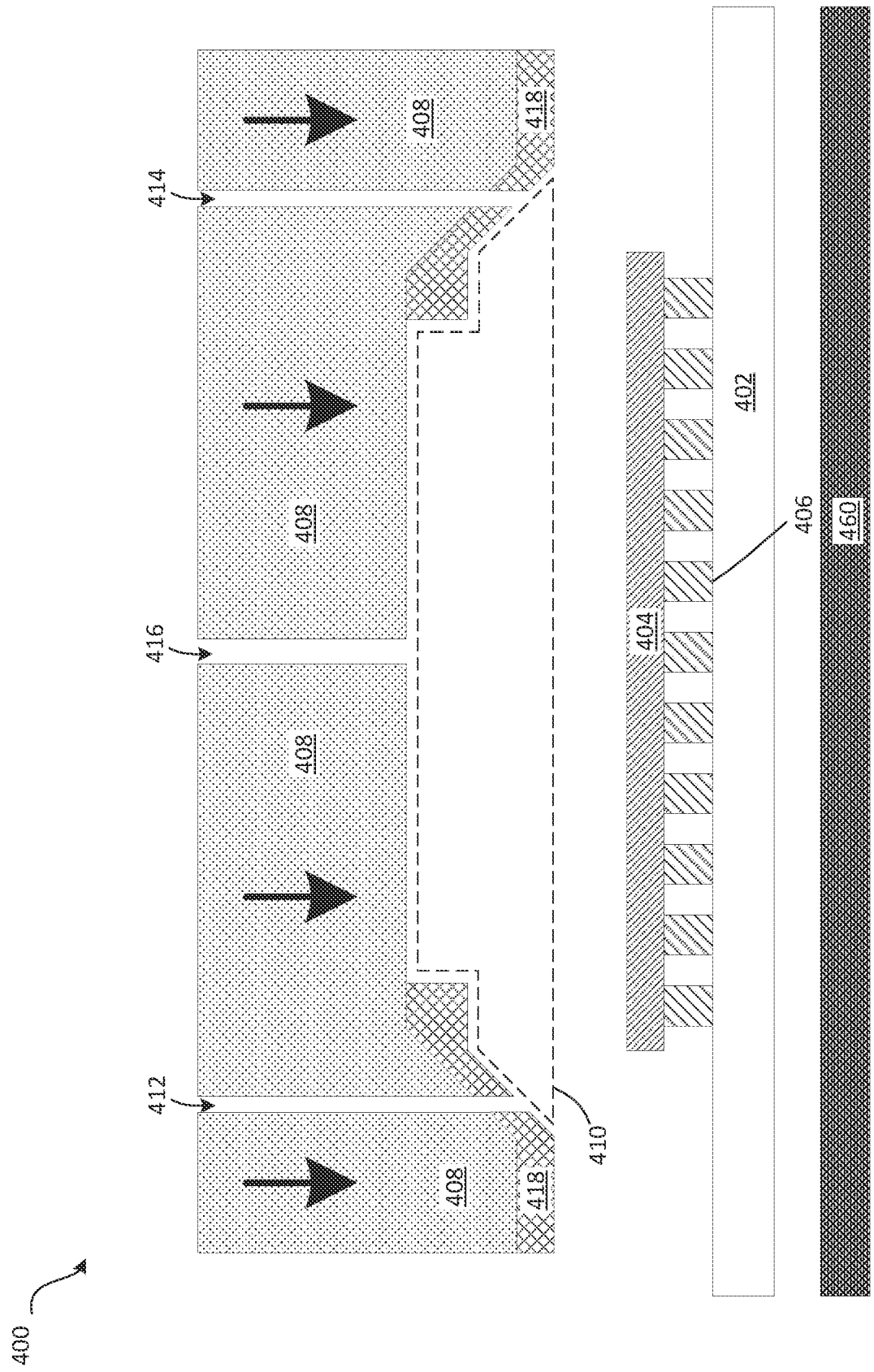
FIGS. 4A-4E are cross-sectional views of an underfill injection device and a method of injecting underfill material using the device, in accordance with certain embodiments.

Referring now to FIGS. 4A-4E and initially to FIG. 4A, an underfill injection device 400 and a method of injecting underfill material using the device are shown, according to certain embodiments. As shown in FIG. 4A, an underfill injection device 400 is shown having a somewhat different structure than the device described above with respect to the FIG. 3, at least with respect to the shape/structure of the underfill injection mold 408 and the antifouling pad 418. In FIG. 4A, the underfill injection mold 408 and the antifouling pad 418 are shown positioned above and separate from the underlying laminate 402. Similar to previously described embodiments, a single chip 404 is attached to the laminate 402 with an array of solder points 406. In certain embodiments, the underfill injection mold 408 defines an interior space 410 that is approximately depicted by the dashed lines in FIG. 4A. In certain embodiments, the interior space 410 of the underfill injection mold 408 is sized appropriately to completely cover and surround the chip 404. In certain embodiments, the underfill injection device 400 includes an antifouling pad 418 that contacts edges of the chip 404 (see, FIG. 4B) to allow for a seal and the creation of a vacuum in the interior space 410. In the embodiment shown in FIG. 4A, the underfill injection mold 408 includes three different orifices, an inlet 412, an outlet 414 for creating the vacuum, and an air release port 416 that allows air to enter the device and release the underfill injection mold 408 from the underlying chip 404 after the underfill material has been filled. In this embodiment, the top of the underfill injection mold 408 spans the entire width of the chip 404, in contrast to the underfill injection mold 308 shown in FIG. 3. It should be appreciated that other structural modifications to the underfill injection mold 408 may be contemplated as long as the overall structure is capable of providing an interior space to cover the chip and is capable of creating a vacuum in this space. As shown in FIG. 4A, in the method of applying the underfill, the underfill injection mold 408 is brought near to the chip 404, as indicated by the downward arrows. As in the embodiments above, a heater 460 may optionally be used to control the viscosity of the underfill material.

Figure 4B:
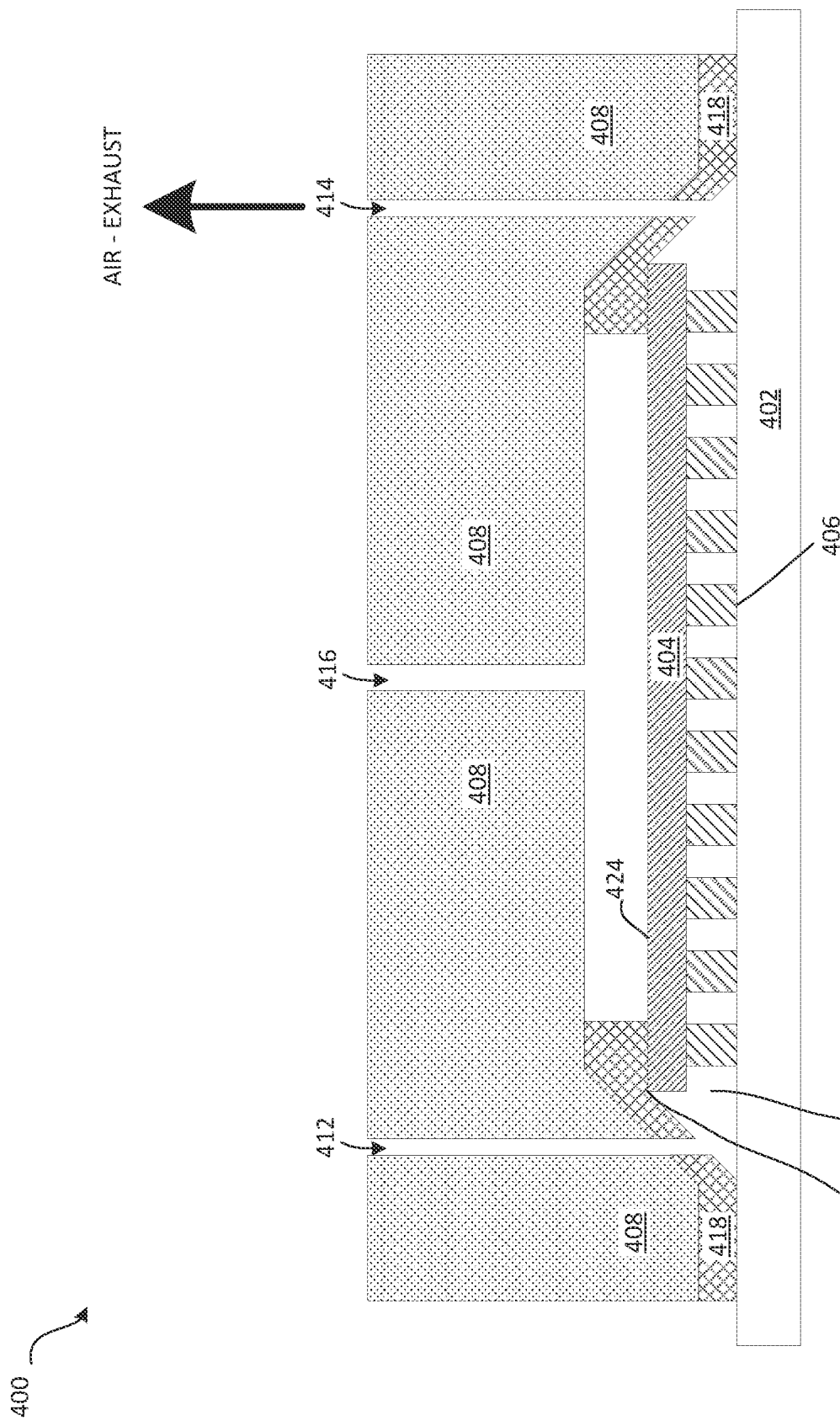

Referring now to FIG. 4B, as the underfill injection mold 408 is brought into contact with the upper surface 424 of the chip 404, the interior space 410 (or the space in which the vacuum is applied) is created when the antifouling pad 418 contacts the upper edges 422 of the chip 404 and portions of the upper surface 424 of the chip 404. The antifouling pad 418 may be comprised of a soft material that may also function as a height adjuster, and may comprise one or more fluorinated or non-fluorinated materials. As shown in FIG. 4B, after the underfill injection mold 408 has been brought into contact with the chip 404, a vacuum is applied at the outlet 414 and air is exhausted therefrom. As in several of the other embodiments, the vacuum helps pull the underfill material 470 (see, FIG. 4C) through the interior space 410 in a direction from the inlet 412 to the outlet 414.

Figure 4C:
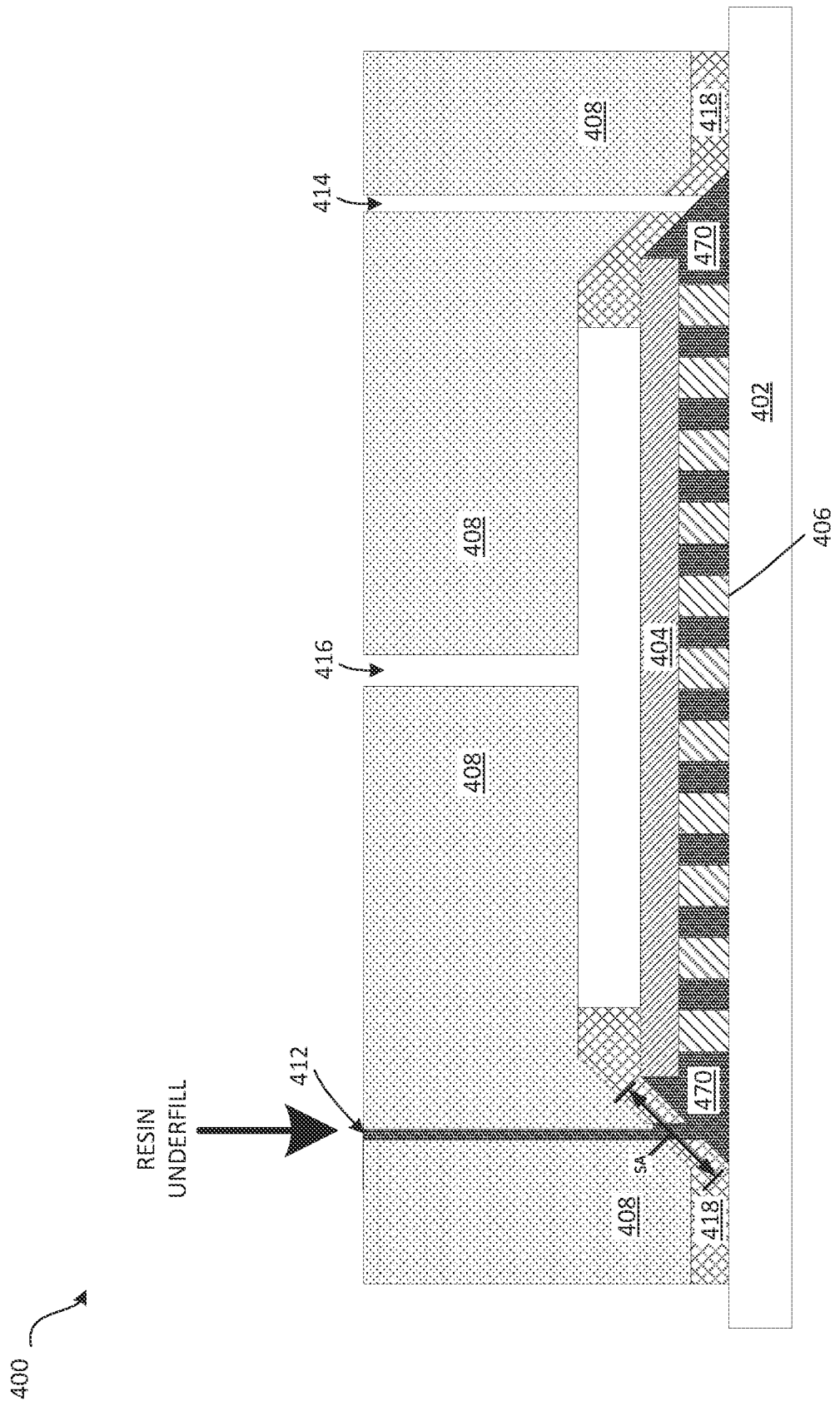

Referring now to FIG. 4C, after a vacuum has been generated in the interior space 410, the underfill material 470 is injected into the inlet 412. The vacuum assists with the propagation of the underfill material 470 under the chip 404 and throughout the solder points 406. At this stage of the manufacturing process, there is only a small surface area SA of contact between the uncured underfill material 470 and the underside of the antifouling pad 418. This relatively small SA may enable the underfill injection mold 408 and the antifouling pad 418 to be released from the injected underfill material 470 prior to performing a curing operation on the underfill. This may have the effect of increasing manufacturing throughput, and this may also enable the use of a different variety of underfill material compositions. Although not shown in FIG. 4C, the antifouling pad 418 may also include a fluorinated membrane or mechanical shutter similar to the fluorinated membrane shown in FIG. 3, which may restrict the underfill material 470 from intruding into the outlet 414 chamber.

Figure 4D:
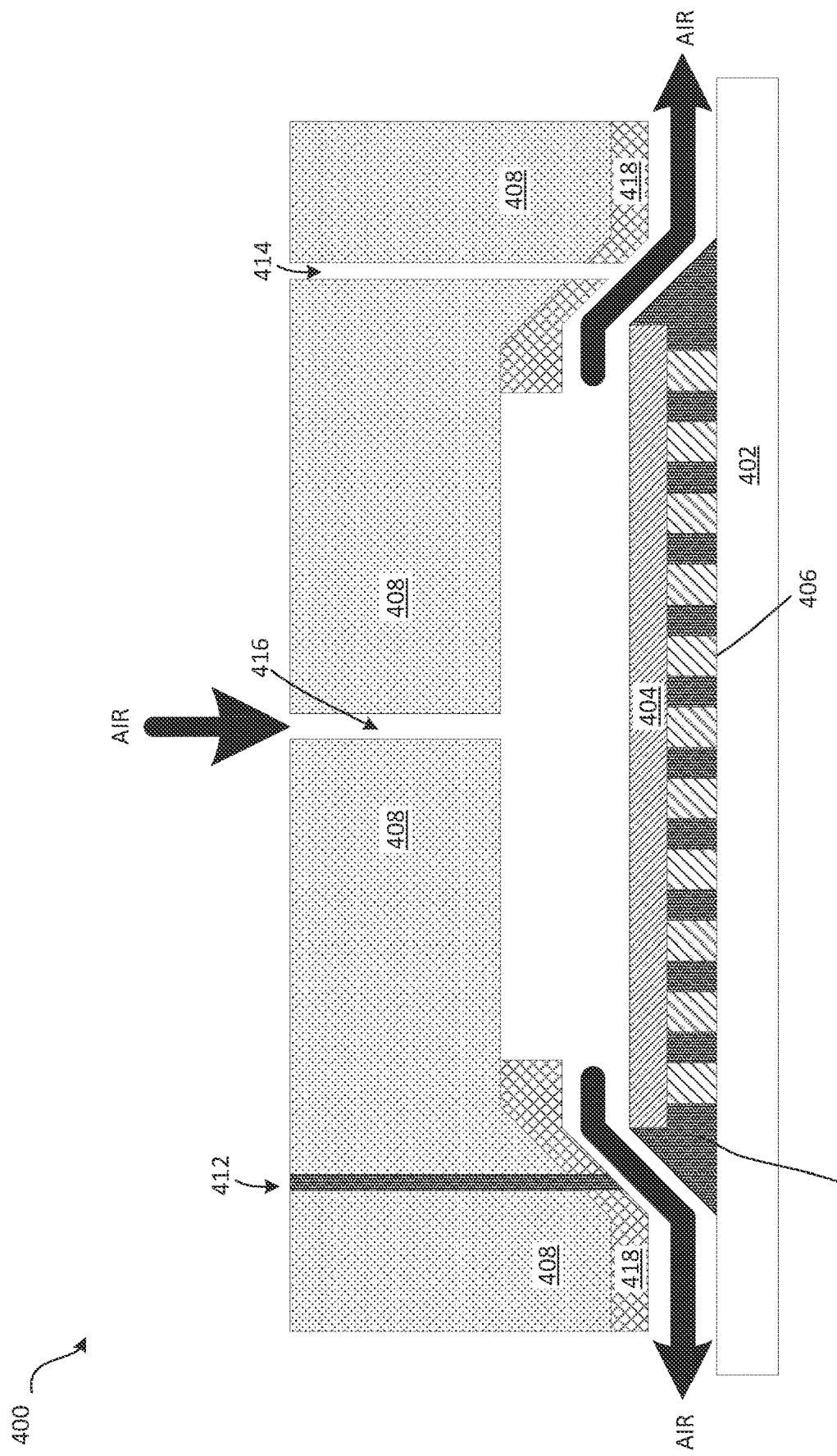
Figure 4E:
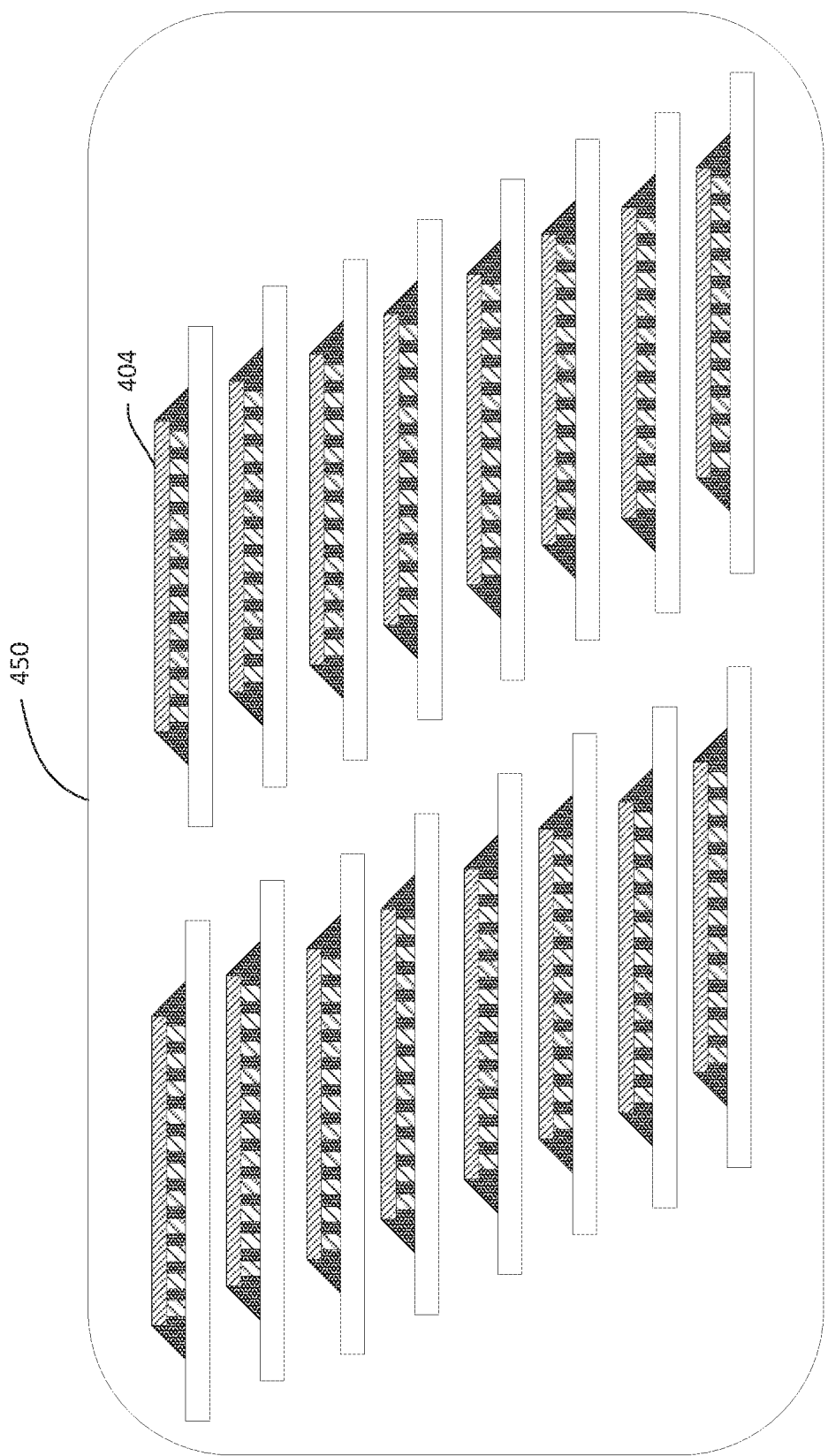

Referring now to FIG. 4D, after the underfill material 470 has been provided, in certain embodiments, the vacuum is released from the outlet 414 side, and air is introduced into the air release port 416. At this stage, the underfill injection mold 408 and the antifouling pad 418 are released from the underlying chip 404. In certain examples, air may be laterally expelled from the spaces formed by the separation of the antifouling pad 418 and the underfill material 470, as indicated by the arrows. As discussed above, there is an effect that the underfill injection mold 408 can be released prior to curing the underfill material 470. This allows a plurality of the chips 404 containing the uncured underfill material 470 to be cured in a batch process, as shown in FIG. 4E. As shown schematically in FIG. 4E, several of the chips 404 can be cured (e.g., in an oven 450 or other heating mechanism) in one processing step.

Figure 5:
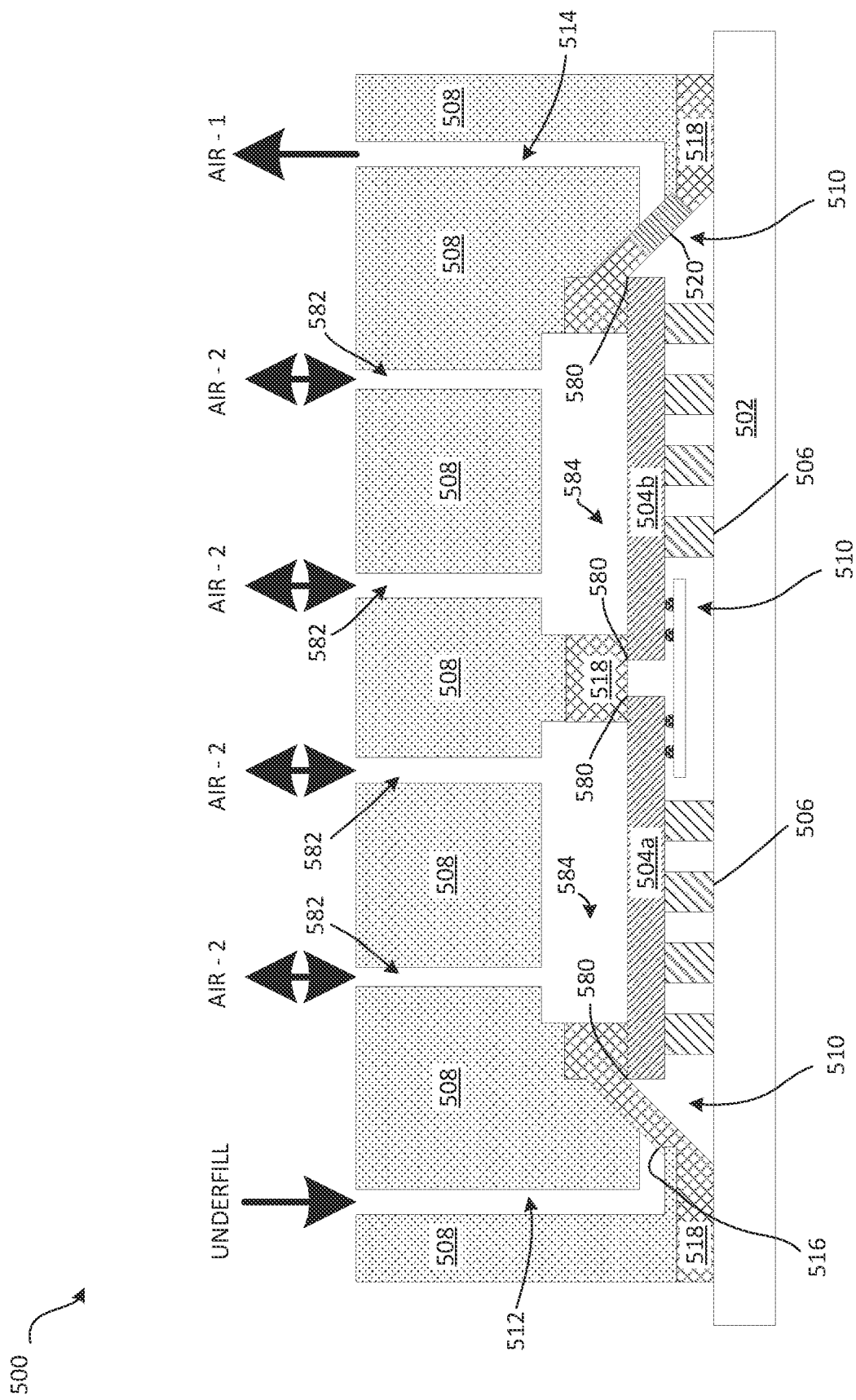
FIG. 5 is a cross-sectional view of an underfill injection device with multiple air release ports and a heterogenous multichip package, in accordance with certain embodiments.

Referring now to FIG. 5, an underfill injection device 500 having a heterogeneous multiple chip structure and a plurality of air exhaust ports is shown, according to certain embodiments. As shown in FIG. 5, an underfill injection device 500 is shown having a somewhat different structure than the device described above with respect to FIG. 3 or FIGS. 4A-4E, at least with respect to the shape/structure of the underfill injection mold 508 and the antifouling pad 518. Two different chips 504a and 504b are attached to the laminate 502 with an array of solder points 506. In certain embodiments, the underfill injection mold 508 defines an interior space 510. In certain embodiments, the interior space 510 of the underfill injection mold 508 is sized appropriately to completely cover and surround the chips 504a and 504b. In certain embodiments, the underfill injection device 500 includes an antifouling pad 518 that contacts edges 580 of the chips 504a and 504b to allow for a seal and the creation of a vacuum in the interior space 510. In the embodiment shown in FIG. 5, the underfill injection mold 508 includes six different orifices, an inlet 512, an outlet 514 for creating the vacuum, and several air release ports 582 that allow air to enter the underfill injection device 500 and release the underfill injection mold 508 from the underlying chips 504a and 504b after the underfill material has been filled. Air-1 is used to create the vacuum in the interior space of under-chip to enable filling the underfill material without voids. Air-2 allows for either a vacuum or positive pressure to be created in the spaces 584 above the chips 504a and 504b. The pressure to the chips 504a and 504b may be controlled by Air-2 to avoid chip damage from any pressures that are applied. In certain embodiments, Air-2 can be also used for releasing the underfill injection mold 508 and controlling temperature.

In this embodiment, the top of the underfill injection mold 508 spans the entire width of the chips 504a and 504b, in contrast to the underfill injection mold 308 shown in FIG. 3. It should be appreciated that other structural modifications to the underfill injection mold 508 may be contemplated as long as the overall structure is capable of providing an interior space to cover the chips and is capable of creating a vacuum in this space. It should also be appreciated that the number of air release ports 582 are not limited to four, and any suitable number of ports may be used. A mechanical shutter 520 or fluorinated membrane may also be used on the outlet 514 side of the underfill injection device 500.

In certain embodiments, after deposition of the underfill material and the release and removal of the underfill injection mold, the underfill material may be cured. The cured properties of the underfill are selected to protect the solder connection points from, e.g., fatigue due to cyclic stress caused by manufacturing and electrical test processing, reliability testing, and operational thermal cycles. The underfill material also protects the back-end-of-line (BEOL) chip structure. An example of a conventional underfill material might be an epoxy resin filled with small silica spheres. The underfill material may be cured at a temperature suitable for the underfill material. One such temperature may be around 150° C.

Figure 6:
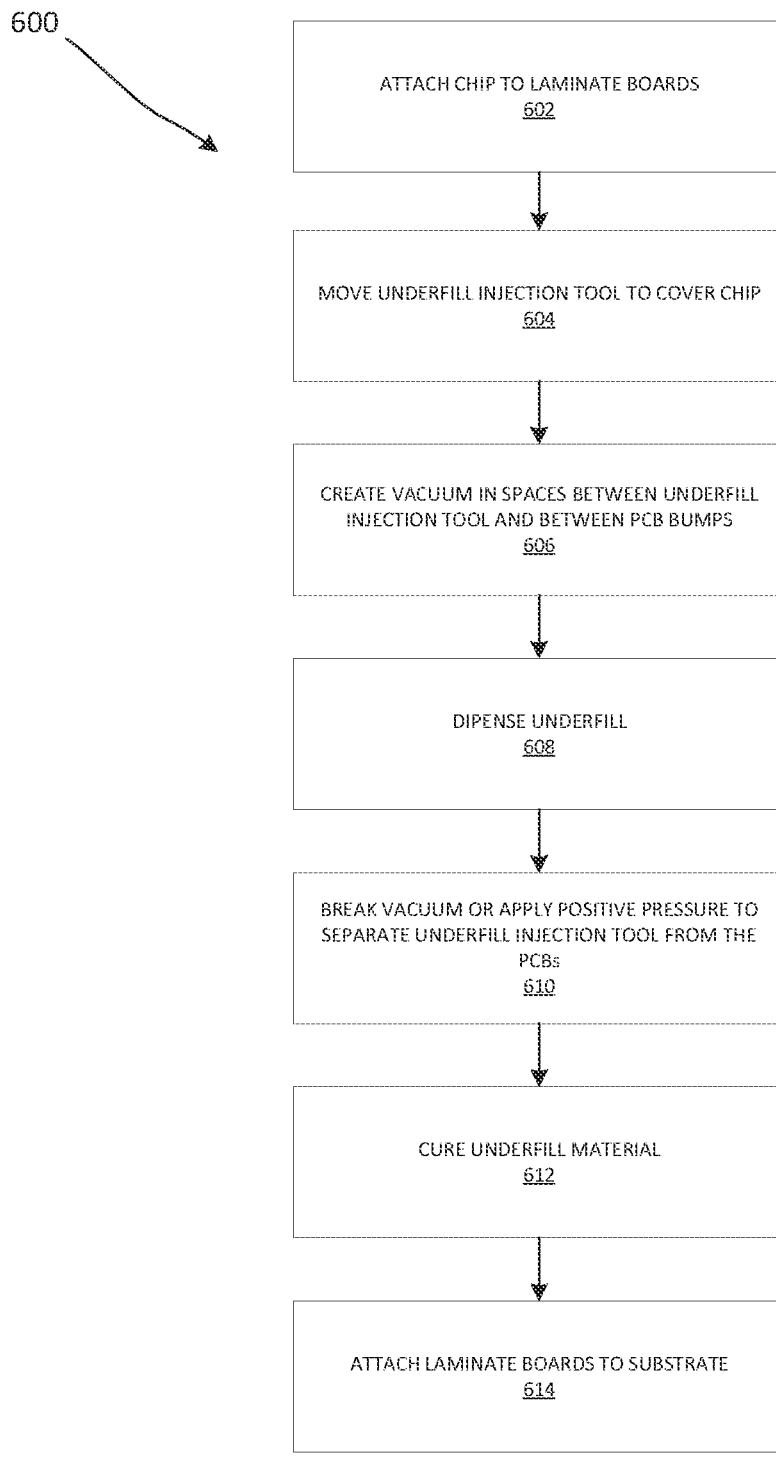
FIG. 6 is a flowchart depicting a method of providing underfill material, in accordance with certain embodiments.

Referring now to FIG. 6, a method 600 of applying underfill using an underfill injection device is shown in the flowchart. It should be noted that several of the method steps outlined in the flow may correspond to the method of injecting underfill shown in FIGS. 4A-4E. At operation 602, a chip (e.g., the chip 104 shown in FIG. 1A) may be attached to the laminate boards with a set of solder points. At operation 604, the underfill injection device or tool is moved into position to cover the chips (see also, FIG. 4A). At operation 606, after the underfill injection mold is in contact with the underlying chip, a vacuum is created in spaces between the underfill injection device and the underlying laminate board, and in the spaces between the solder points (see also, FIG. 4B). At operation 608, underfill material is dispensed (see also, FIG. 4C). At operation 610, after the underfill material has been dispensed, the vacuum is broken and/or positive air pressure is applied to separate the underfill injection device from the underlying chip (see also, FIG. 4D). At operation 612, after the removal of the underfill injection device, the underfill material may be cured. Thus, as discussed above, the underfill material does not need to be cured prior to the removal of the underfill injections device, and a plurality of the chips may be cured in bulk (see also, FIG. 4E). At operation 614, laminate board (e.g., the laminate 102 shown in FIG. 1A) is attached to the substrate (e.g., the substrate 101 shown in FIG. 1A). The laminate board may be attached to the substrate with an array of solder connection points (e.g., the solder connection points 106), for example.

Figure 7:
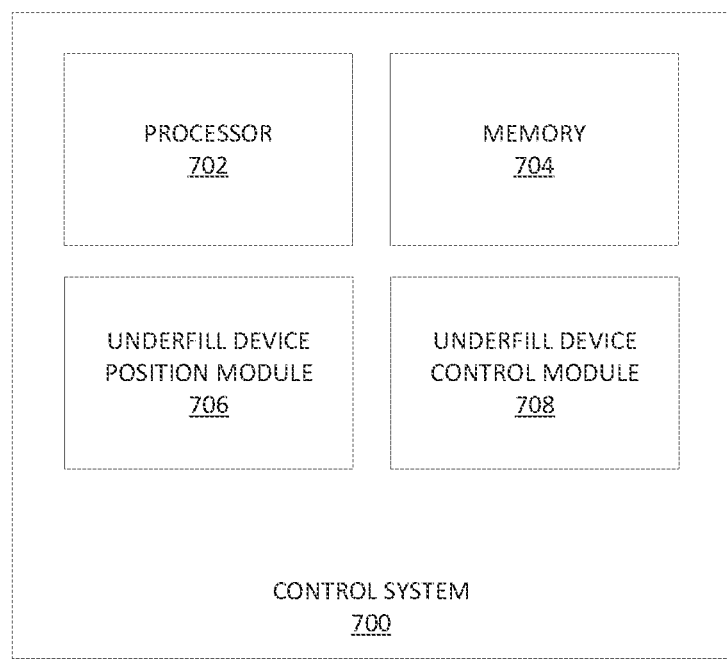
FIG. 7 is a block diagram of an underfill deposition control system, in accordance with certain embodiments.

Referring now to FIG. 7, an abstract view of a control system 700 is shown. The control system 700 may control certain aspects of the underfill injection device, such as the positioning of the underfill injection mold, the initiation and termination of the vacuum, the injection of the underfill material, and the control of the mechanical shutter near the outlet of the underfill injection mold. The control system 700 includes a hardware processor 702 and memory 704. In addition, the control system 700 includes one or more functional modules that may, for example, include software instructions that are stored in memory 704 and executed by the processor 702. Alternatively, the functional modules may be implemented as one or more discrete hardware components in the form of, e.g., application specific integrated chips or field programmable gate arrays.

In particular, the control system 700 includes a underfill device position module 706. The underfill device position module 706 issues commands to the underfill injection device 400 to change the position of the underfill injection mold 408 relative to the one or more chips 404. The underfill device position module 706 may issue these commands based on a predetermined set of movements, stored in memory 704, or may adaptively locate the chip 404 using one or more sensor inputs. It should be recognized that the underfill device position module 706 will therefore have at least one external interface to components outside the control system 700, including a command interface to an underfill material dispenser and optionally a sensor interface to the one or more sensors. In certain embodiments, the underfill injection device 400 may need to be precisely aligned with the chip 404 to ensure a proper vacuum seal, the underfill device position module 706 is configured to determine the relative location of the underfill injection device 400 relative to the chip 404, and then cause the underfill injection device 400 to be moved into proper alignment.

In addition, the control system 700 includes an underfill control module 708. The underfill control module 708 issues commands to an underfill dispenser (not shown) to dispense underfill material through the input port of the underfill injection mold 408. The underfill control module 708 therefore interacts with the underfill device position module 706 to determine when the underfill injection mold is aligned with the underlying chip. The underfill control module 708 may dispense a predetermined volume of underfill material into the interior space 410. Toward this end, the underfill control module 708 will have at least one external interface to components outside the control system 700, including a command interface to the dispenser and optionally a sensor interface to one or more sensors.

Figure 8:
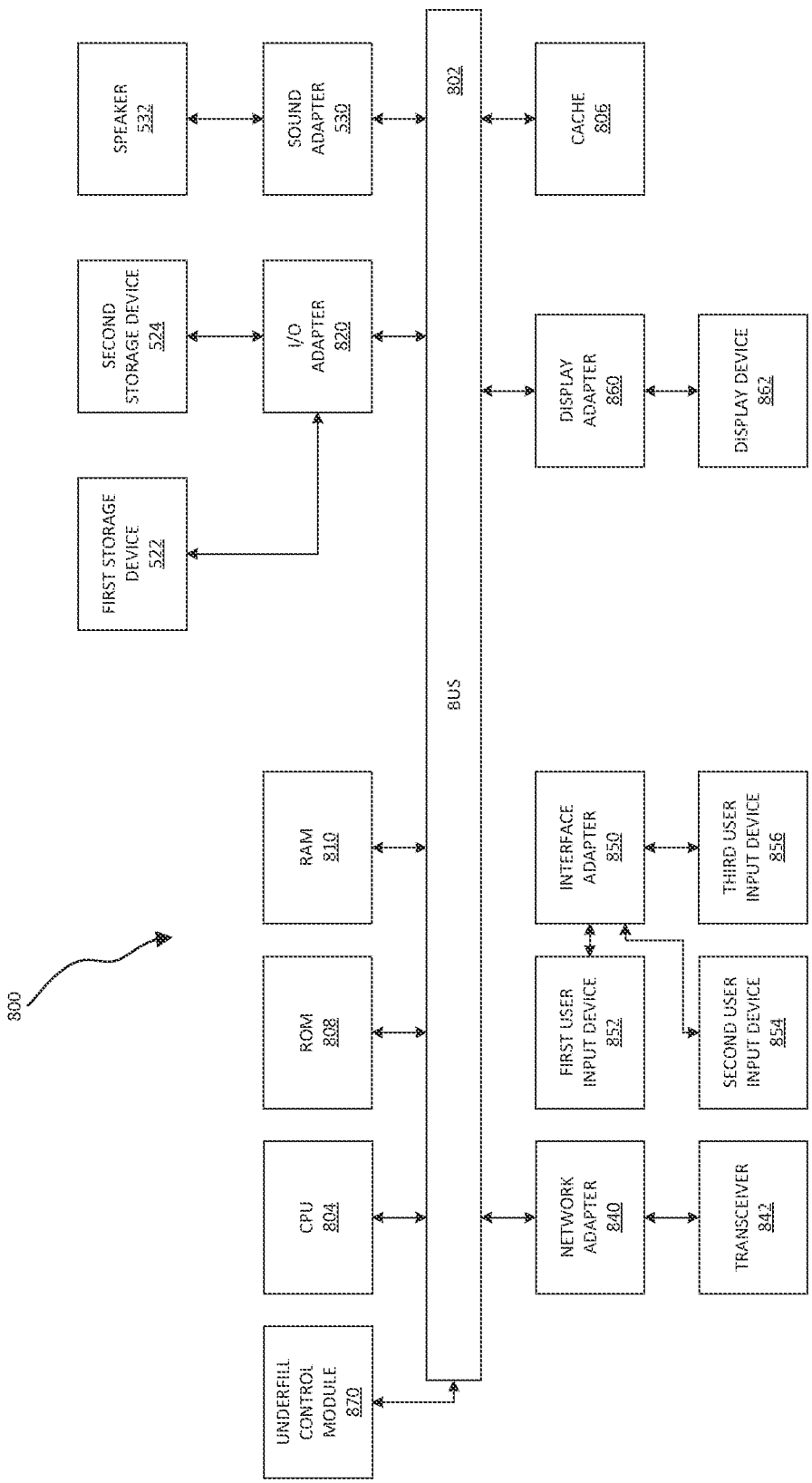
FIG. 8 is a block diagram of a processing system, in accordance with certain embodiments.

Referring now to FIG. 8, an exemplary processing system 800 is shown which may represent the control system 700 shown in FIG. 7. The processing system 800 includes at least one processor (CPU) 804 operatively coupled to other components via a system bus 802. A cache 806, a Read Only Memory (ROM) 808, a Random Access Memory (RAM) 810, an input/output (I/O) adapter 820, a sound adapter 830, a network adapter 840, a user interface adapter 850, and a display adapter 860, are operatively coupled to the system bus 802.

A first storage device 822 and a second storage device 824 are operatively coupled to system bus 802 by the I/O adapter 820. The storage devices 822 and 824 can be any of a disk storage device (e.g., a magnetic or optical disk storage device), a solid state magnetic device, and so forth. The storage devices 822 and 824 can be the same type of storage device or different types of storage devices.

A speaker 832 is operatively coupled to system bus 802 by the sound adapter 830. A transceiver 842 is operatively coupled to system bus 802 by network adapter 840. A display device 862 is operatively coupled to system bus 802 by display adapter 860.

An underfill control module 870 may also be operatively coupled to the bus 802, and this may correspond with the control system 700 shown in FIG. 7.

A first user input device 852, a second user input device 854, and a third user input device 856 are operatively coupled to system bus 802 by user interface adapter 850. The user input devices 852, 854, and 856 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 852, 854, and 856 can be the same type of user input device or different types of user input devices. The user input devices 852, 854, and 856 are used to input and output information to and from system 800.

Of course, the processing system 800 may also include other elements (not shown), as readily contemplated by one of skill in the art, as well as omit certain elements. For example, various other input devices and/or output devices can be included in processing system 800, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 800 are readily contemplated by one of ordinary skill in the art given the teachings of the present principles provided herein.

The present embodiments enable high yield underfilling for complex packages such as AI hardware packages. The present embodiments may also enable reliable large die package by utilizing higher fine-filler-content underfill. The present embodiments may improve the cost effectiveness of the manufacturing process due to minimum underfill volume compared with other molding structures. For example, the underfill injection area may be limited to only underneath the chip. In particular, the underfill injection area may be approximately the chip size plus the underfill fillet area (e.g., a2 mm fillet length on each side of the chip). The present embodiments may also allow for faster throughput due to the reductions in time needed to pull a vacuum, and due to the batch curing of the underfill material after the underfill injection tool has already been removed. The present embodiments may also eliminate void-caused fails, and they may allow for a reduction in capital investment (compared with related vacuum chamber tools).

The present embodiments may be a system, a device, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that the present embodiments will be described in terms of a given illustrative architecture; however, other architectures, structures, substrate materials and process steps/blocks can be varied within the scope of the present disclosure. It should be noted that certain features cannot be shown in all figures for the sake of clarity. This is not intended to be interpreted as a limitation of any particular embodiment, or illustration, or scope of the claims.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device for applying underfill material into a first space between a substrate and a semiconductor chip, the device comprising:
    a frame housing configured to cover at least an outer edge area of the semiconductor chip that is bonded to the substrate, the frame housing configured to form a second space above the semiconductor chip, the second space being separate from the first space;
    a sealant attached to the frame housing and configured to contact the outer edge area of the semiconductor chip;
    an outlet made on the frame housing for evacuating the first space;
    an inlet made on the frame housing for injecting the underfill material to the first space; and
    an exhaust port on the frame housing for pressurizing or evacuating the second space.

2. The device of claim 1, wherein the sealant has an antifouling property.

3. The device of claim 1, wherein the sealant comprises at least one fluorinated polymer.

4. The device of claim 1, wherein the sealant has a portion that is inclined relative to a main surface of the substrate, and wherein the inclined portion of the sealant corresponds to a shape of a fillet portion of the underfill material.

5. The device of claim 1, wherein the sealant includes a mechanical shutter on an outlet side of the device.

6. The device of claim 1, wherein the sealant includes a fluorinated gas permeable membrane on an outlet side of the device.

7. The device of claim 1, wherein the sealant is configured to contact at least outer upper edges of the semiconductor chip to form the first space that is sealed for the underfill material.

8. The device of claim 7, wherein a size of the first space at least substantially corresponds to a size of the semiconductor chip.

9. The device of claim 7, wherein a size of the first space at least substantially corresponds to a size of the semiconductor chip plus a size of a fillet portion of the underfill material.

10. A method for applying underfill material into a first space between a substrate and a semiconductor chip, the method comprising:
    providing a frame housing configured to cover an outer edge area of the semiconductor chip that is bonded to the substrate, the frame housing configured to form a second space above the semiconductor chip, the second space being separate from the first space;
    adhering a sealant that is attached to the frame housing to the outer edge area to seal the first space;
    reducing pressure in the first space by evacuating gases through an outlet on the frame housing;
    injecting the underfill material into the first space through an inlet on the frame housing; and
    after injecting the underfill, increasing the pressure in the second space by introducing a gas into at least one exhaust port included in the frame.

11. The method of claim 10, wherein the sealant has an antifouling property.

12. The method of claim 10, wherein the sealant comprises at least one fluorinated polymer.

13. The method of claim 10, wherein the sealant has a portion that is inclined relative to a main surface of the substrate, and wherein the inclined portion of the sealant corresponds to a shape of a fillet portion of the underfill material.

14. The method of claim 10, further comprising, after injecting the underfill material, removing the frame and the sealant from the semiconductor chip.

15. The method of claim 14, further comprising curing the underfill material.

16. The method of claim 10, wherein the sealant is configured to contact at least outer upper edges of the semiconductor chip to form a the first space for the underfill material.

17. The method of claim 16, wherein a size of the first space at least substantially corresponds to a size of the semiconductor chip.

18. The method of claim 16, wherein a size of the first space at least substantially corresponds to a size of the semiconductor chip plus a size of a fillet portion of the underfill material.

19. A system for applying underfill material into a first space between a substrate and a semiconductor chip, the system comprising:
- at least one processor;
- at least one memory coupled to the processor;
- an underfill injection device including
  - a frame housing configured to cover at least an outer edge area of the semiconductor chip that is bonded to the substrate, the frame housing configured to form a second space above the semiconductor chip, the second space being separate from the first space,
  - a sealant attached to the frame housing and configured to contact the outer edge area of the semiconductor chip,
  - an outlet made on the frame housing for evacuating the first space, and an inlet made on the frame housing for injecting the underfill material to the first space;
  - an exhaust port on the frame housing for pressurizing or evacuating the second space;
- an underfill device position module operable with the processor and memory to cause the underfill injection device to be moved into alignment with the semiconductor chip; and
- an underfill device control module operable with the processor and the memory to cause the injection of the underfill material into the space.

20. The system of claim 19, wherein the sealant has an antifouling property.

21. The system of claim 19, wherein the sealant comprises at least one fluorinated polymer.

22. The system of claim 19, wherein the sealant has a portion that is inclined relative to a main surface of the substrate, and wherein the inclined portion of the sealant corresponds to a shape of a fillet portion of the underfill material.

23. The system of claim 19, further comprising a plurality of exhaust ports.

* * * * *